United States Patent
Lee et al.

(10) Patent No.: US 7,425,730 B2
(45) Date of Patent: Sep. 16, 2008

(54) ORGANIC ELECTRO-LUMINESCENT DISPLAY AND FABRICATION METHOD THEREOF

(75) Inventors: Ho-nyeon Lee, Seongnam-si (KR);
Sung-kee Kang, Seongnam-si (KR);
Jung-woo Kim, Yongin-si (KR);
Ick-hwan Ko, Seoul (KR); Young-gu Lee, Suwon-si (KR); Hong-shik Shim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/555,493

(22) Filed: Nov. 1, 2006

(65) Prior Publication Data

US 2007/0187680 A1    Aug. 16, 2007

(30) Foreign Application Priority Data

Feb. 10, 2006    (KR) .................. 10-2006-0013068

(51) Int. Cl.
*H01L 51/20* (2006.01)
(52) U.S. Cl. .................. 257/98; 257/40; 257/59; 257/72; 257/88; 257/98; 257/E51.018; 257/E51.021
(58) Field of Classification Search .......... 257/40, 257/59, 72, 88, 98, E51.018, E51.021
See application file for complete search history.

(56) References Cited

U.S. PATENT DOCUMENTS

| | | | |
|---|---|---|---|
| 6,538,390 B2 | 3/2003 | Fujita et al. | |
| 6,797,985 B1* | 9/2004 | Meng et al. | 257/83 |
| 6,825,496 B2* | 11/2004 | Yamazaki et al. | 257/72 |
| 6,836,070 B2 | 12/2004 | Chung et al. | |
| 2006/0040425 A1* | 2/2006 | Tanabe | 438/108 |
| 2007/0112172 A1* | 5/2007 | Li et al. | 528/377 |
| 2007/0160847 A1* | 7/2007 | Ong et al. | 428/411.1 |

* cited by examiner

*Primary Examiner*—Sue A. Purvis
*Assistant Examiner*—Victor A Mandala, Jr.
(74) *Attorney, Agent, or Firm*—Cantor Colburn LLP

(57) ABSTRACT

In an organic electro-luminescent display, a pixel circuit is disposed in a unit pixel region defined on a substrate. A passivation layer covers the entire unit pixel region including the pixel circuit. An organic light emitting diode ("OLED") including a transparent lower electrode formed on a portion of the passivation layer which does not overlap the pixel circuit, an OLED layer, and an upper electrode are sequentially formed on the passivation layer. The transparent lower electrode is a transparent anode of the OLED. A protective layer is formed of the same material as the transparent lower electrode and disposed on a portion of the passivation layer corresponding to the pixel circuit to cover and protect the pixel circuit.

20 Claims, 4 Drawing Sheets

ORGANIC ELECTRO-LUMINESCENT DISPLAY AND FABRICATION METHOD THEREOF

This application claims priority to Korean Patent Application No. 10-2006-0013068, filed on Feb. 10, 2006, and all the benefits accruing therefrom under 35 U.S.C. §119, the contents of which in its entirety are herein incorporated by reference.

BACKGROUND OF THE INVENTION

1. Field of the Invention

The present invention relates to an organic electro-luminescent display ("OELD"), and more particularly, to an OELD using two panels.

2. Description of the Related Art

Organic electro-luminescent displays ("OELDs") are self-luminescent displays which use an organic compound as a luminescent material. OELDs are simpler, less expensive to fabricate, have lower power consumption, smaller thickness, and higher response speed than non-luminescent thin film transistor ("TFT") liquid crystal displays ("LCDs").

Active matrix OELDs include a plurality of organic light emitting diodes ("OLEDs") arranged in an X-Y matrix configuration and a semiconductor circuit driving the OLEDs. The OELDs are generally classified into top emission type OELDs and bottom emission type OELDs according to the direction of light emission. Top emission type displays emit light more or less directly to an outside and bottom emission type displays emit light through a bottom substrate before reaching the outside.

Top emission type OELDs include a plurality of pixels, wherein each pixel includes a plurality of pixel circuits including a plurality of transistors and an OLED is disposed on each pixel circuit, such that the OLED overlaps the corresponding pixel circuit. On the other hand, in bottom emission type OELDs, which also include a plurality of pixels, a pixel circuit and a corresponding OLED are disposed such that they do not completely overlap each other.

In top emission type OELDs, a pixel circuit of each pixel is formed in part of the pixel. A passivation layer (or a planarization layer) is formed on the entire pixel including the pixel circuit using an insulating material. An OLED occupying a large portion of the pixel is formed on the passivation layer.

In bottom emission type OELDs, since light emitted from an OLED must penetrate a substrate, the OLED is formed such that it does not overlap an opaque pixel circuit region incapable of transmitting light.

In the fabrication of the OELD, a plasma surface treatment is performed on an anode formed of a transparent material such as indium tin oxide ("ITO"). This plasma surface treatment may damage a transistor of the pixel circuit which is covered by a passivation layer but is not covered by the anode. Although the pixel circuit is covered with the passivation layer, it may be damaged by high-energy plasma penetrating the passivation layer. Moreover, the transistor of the pixel circuit may be damaged by an organic liquid material used to form the OLED.

BRIEF SUMMARY OF THE INVENTION

The present invention provides an organic electro-luminescent display ("OELD") which has a structure which can protect a pixel circuit during an organic light emitting diode formation process, and a fabrication method thereof.

According to an aspect of the present invention, there is provided an exemplary embodiment of an OELD including; a substrate, a pixel circuit disposed in a unit pixel region defined on the substrate, a passivation layer covering the unit pixel region including the pixel circuit, an organic light emitting diode ("OLED") including a transparent lower electrode, organic light emitting layers, and an upper electrode which are sequentially formed on a portion of the passivation layer which overlaps a different area than the pixel circuit, and a protective layer formed of the same material as the transparent lower electrode and disposed on another portion of the passivation layer which overlaps the pixel circuit.

The transparent lower electrode and the protective layer may be formed of a conductive oxide selected from the group consisting of indium tin oxide and indium zinc oxide.

According to another aspect of the present invention, there is provided an exemplary embodiment of a method of fabricating an OELD, the method including; forming a pixel circuit in each pixel region on a substrate, forming a passivation layer which protects the pixel circuit, forming a transparent lower electrode material layer on the passivation layer, patterning the transparent lower electrode material layer to form a protective layer on a portion of the passivation layer which corresponds to the pixel circuit and a transparent lower electrode on a portion of the passivation layer which overlaps a different area than the pixel circuit, and forming an OLED layer and a reflective upper electrode on the lower electrode.

The method may further include forming a bank between the passivation layer and the OLED layer, wherein the bank is formed with a window such that the transparent lower electrode is exposed by the window.

BRIEF DESCRIPTION OF THE DRAWINGS

The above and other aspects, features and advantages of the present invention will become more apparent by describing in more detail exemplary embodiments thereof with reference to the attached drawings in which.

DETAILED DESCRIPTION OF THE INVENTION

Figure 1A:
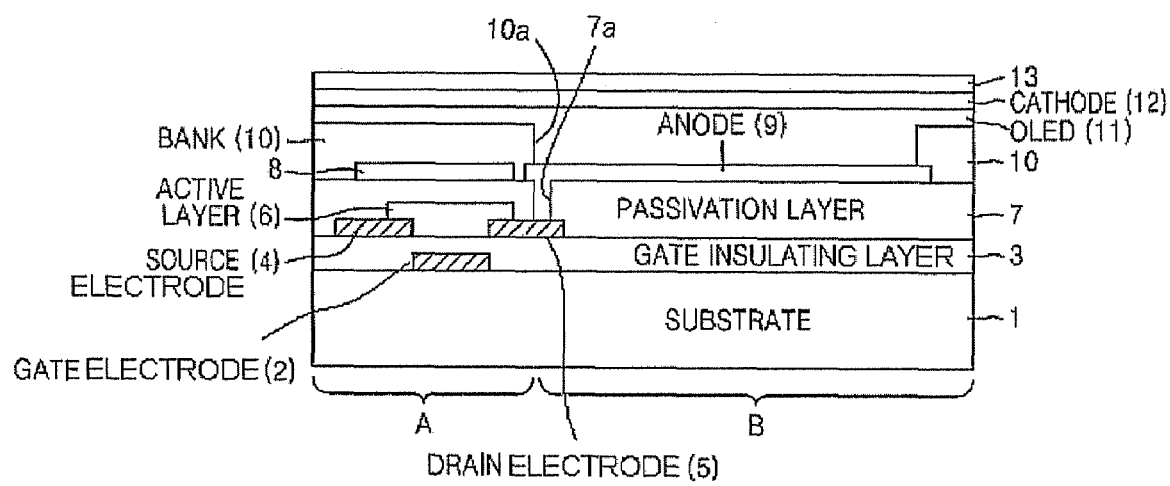
FIG. 1A is a cross-sectional view of an exemplary embodiment of an organic electro-luminescent display ("OELD") according to the present invention.

The present invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, exemplary embodiments of the present invention should not be construed as being limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

The present invention will now be described more fully with reference to the accompanying drawings, in which exemplary embodiments of the invention are shown.

Figure 1B:
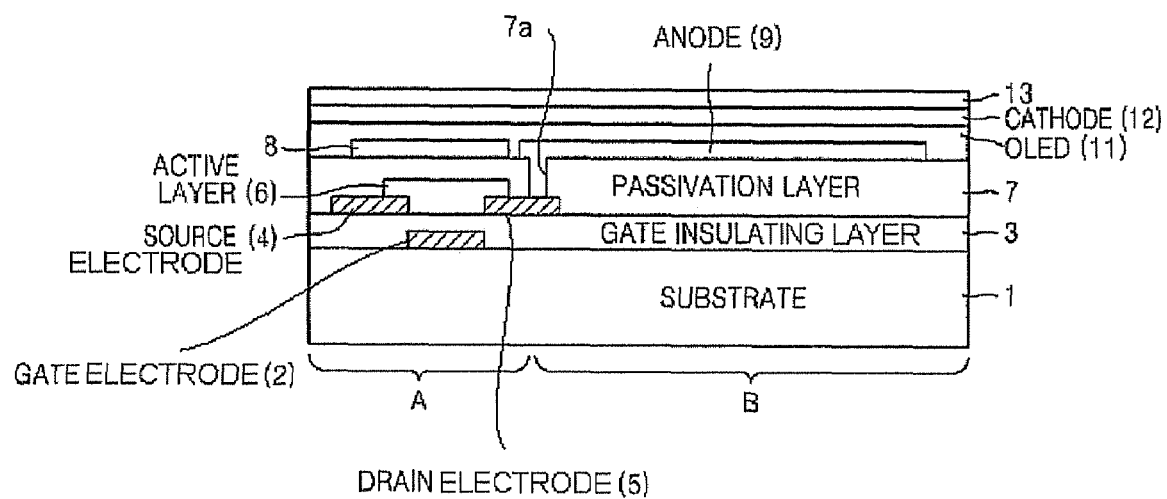
FIG. 1B is a cross-sectional view of another exemplary embodiment of an OELD according to the present invention.

FIGS. 1A and 1B are cross-sectional views of exemplary embodiments of organic-electro luminescent displays ("OELDs") according to the present invention.

FIGS. 1A and 1B are cross-sectional views each illustrating one sub-pixel of corresponding OELDs. Although each sub-pixel of an electro luminescent display includes a switching transistor, a storage capacitor and a driving transistor, the switching transistor and the storage capacitor are omitted from the cross-sectional view for clarity and conciseness. FIGS. 1A and 1B illustrate only a stacked structure of the driving transistor and an organic light emitting diode ("OLED") driven by the driving transistor.

Referring to FIG. 1A, a pixel circuit is disposed in a region A, and an OLED driven by the pixel circuit is disposed in a region B. In the region A, a gate electrode 2 is formed on a substrate 1, and a gate insulating layer 3 is formed on the resulting structure. The gate insulating layer 3 covers not only the region A but also the region B. A source electrode 4 and a drain electrode 5 are formed on the gate insulating layer 3 on regions corresponding to areas on opposing sides of the gate electrode 2. An active layer 6 is formed on the source electrode 4, the drain electrode 5 and a portion of the gate insulating layer 3 which is between the source electrode 4 and the drain electrode 5 such that ends of the active layer 6 partially cover the source electrode 4 and the drain electrode 5, respectively. Exemplary embodiments of the active layer 6 are formed of an organic or inorganic semiconductor material. A passivation layer 7 is formed on the active layer 6. The passivation layer 7 extends into the region B such that it serves as a planarization layer. A protective layer 8 and an anode (also called a lower electrode) 9 are formed on the passivation layer 7. The passivation layer 7 includes a contact hole 7a allowing the anode 9 to contact the drain electrode 5. Exemplary embodiments of the protective layer 8 and the anode 9 are formed of a transparent conductive material such as indium tin oxide ("ITO") and indium zinc oxide ("IZO"). The protective layer 8 and the anode 9 are disposed in the region A and the region B, respectively.

A bank 10 with a window 10a is formed on the protective layer 8, the passivation layer 7 and the anode 9 such that a portion of the anode 9 is exposed through the window 10a. An OLED layer 11 is formed on the bank 10 and the anode 9 exposed through the window 10a. The OLED layer 11 includes at least a hole transport layer and a luminescent layer. A cathode (also called an upper electrode) 12 is formed on the OLED layer 11. Exemplary embodiments of the cathode 12 are formed of a reflective conductive material such as a metal. A sealing layer 13 is formed on the cathode 12.

The OELD described above is characterized in that the protective layer 8 is formed simultaneously, or nearly simultaneously, with the anode 9. The anode 9 is surface-treated with plasma, and the OLED layer 11 is formed of an organic liquid material. Before plasma surface treatment for the anode 9 and formation of the OLED layer 11, the protective layer 8 is formed to cover the pixel circuit which includes transistors, thereby preventing the pixel circuit (specifically the transistors of the pixel circuit) from being damaged by the plasma and the organic liquid material. This transistor protection has remarkable effects when an organic passivation layer and an organic semiconductor are used in the OELD.

An OELD of FIG. 1B is substantially similar to the OELD of FIG. 1A with the exception that it does not include the bank 10.

Referring to FIG. 1B, a gate electrode 2, a gate insulating layer 3, source/drain electrodes 4 and 5, an active layer 6, a passivation layer 7 with a hole 7a, and a protective layer 8 are sequentially formed on a substrate 1 in region A. The gate insulating layer 3 and the passivation layer 7 are formed in region B as well as in region A. In region B, the gate insulating layer 3, the passivation layer 7, and an anode 9 are sequentially formed on the substrate 1. The anode 9 and the protective layer 8 are simultaneously, or nearly simultaneously, formed on the passivation layer 7. In one exemplary embodiment the anode 9 and the protective layer 8 may be formed using the same material. The protective layer 8 is electrically isolated from the anode 9 and is formed to protect a pixel circuit in region A.

In the exemplary embodiments of FIGS. 1A and 1B, the OELD is implemented using a p-channel TFT. However, the present invention is not limited to thereto. Alternative exemplary embodiments include the configuration where the OELD is implemented using an n-channel TFT. In such an alternative exemplary embodiment, an anode of an OLED is connected to a source electrode of a driving transistor and a cathode of the OLED is grounded.

In the exemplary embodiments shown in FIGS. 1A and 1B, the pixel circuit is formed of an organic semiconductor material. However, the present invention is not limited to this configuration. Alternative exemplary embodiments include configurations where the pixel circuit is formed of an inorganic semiconductor material such as silicon and ZnO and the materials for the other elements are selected accordingly. This material selection can be readily made according to well-known technology.

Exemplary embodiments of the organic semiconductor material include a p-type semiconductor material such as pentacene. Exemplary embodiments of the source/drain electrodes 4 and 5 may be formed of Au or Cr/Au. Exemplary embodiments of an n-type organic semiconductor material may be formed of copper hexadecafluorophthalocyanine ("F16CuPc"), naphthalene-tetracaboxylic-dianhydride ("NTCDA"), or fluorohexylsexithiopehne ("DHF-6T"). The gate insulating layer 3 and the passivation layer 7 may be formed of a well-known organic or inorganic insulating material. Exemplary embodiments of the organic insulating material are polyvinylpyrrolidone ("PVP") and polyvinylacetate ("PVA"). Exemplary embodiments of the inorganic insulating material are $SiO_2$, $Si_2N_3$, $Al_2O_3$, and $SiRiO_3$. Exemplary embodiments of the bank 10 may be formed of a carbon-based black photoresist, polyvinyl alcohol ("PVA"), photo acryl ("PA"), and polyimide ("PI"). Exemplary embodiments of the substrate 1 may be formed of glass or plastic such as polyethersulfone ("PES"), polyethylene terephthalate ("PET") and polycarbonate ("PC") plastics.

FIGS. 2A through 2J are cross-sectional views illustrating an exemplary embodiment of a method of fabricating an OELD according to the present invention.

A method of fabricating the exemplary embodiment of an OELD of FIG. 1A will now be described in more detail with reference to FIGS. 2A through 2J. A method of fabricating the OELD of FIG. 1B can also be understood from FIGS. 2A through 2J, with the exception of the formation of the bank 10.

Figure 2A:
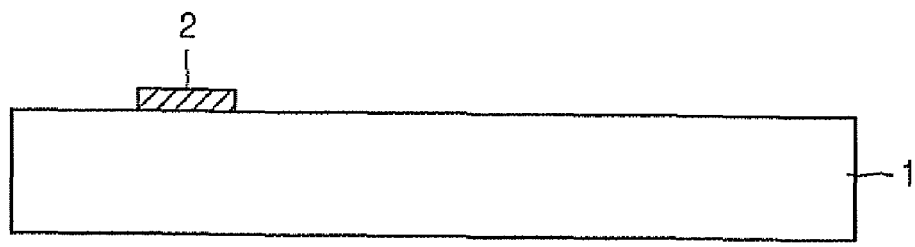
FIGS. 2A through 2J are cross-sectional views illustrating an exemplary embodiment of a method of fabricating an OELD according to the present invention.

Referring to FIG. 2A, a gate electrode 2 is formed on a substrate 1.

Figure 2B:
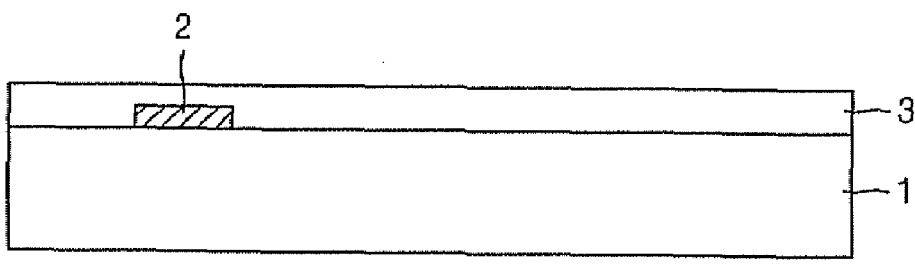

Referring to FIG. 2B, a gate insulating layer 3 is formed on the resulting structure of FIG. 2A including the gate electrode 2. Exemplary embodiments of the gate insulating layer 3 may be formed of an organic material such as PVP and PVA or of an inorganic material such as $SiO_2$, $Si_2N_3$, $Al_2O_3$, and $SiRiO_3$.

Figure 2C:
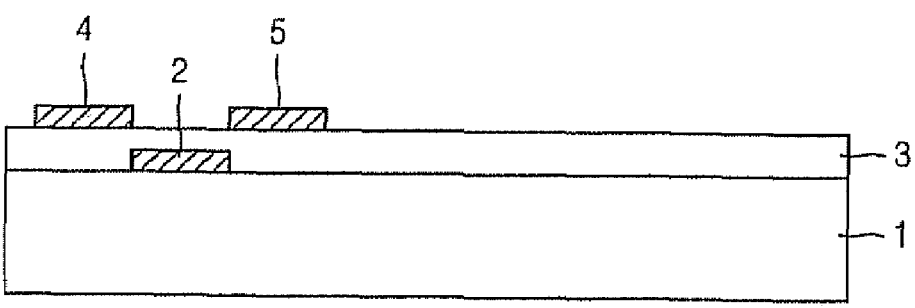

Referring to FIG. 2C, a source electrode 4 and a gate electrode 5 are formed on the gate insulating layer 3 on regions corresponding to areas on opposing sides of the gate electrode 2. Exemplary embodiments of the source/drain electrodes 4 and 5 each may be formed of Au or Cr. Alternative exemplary embodiments of the source/drain electrodes 4 and 5 may be formed to have the structure of a Cr/Au dual layer.

Figure 2D:
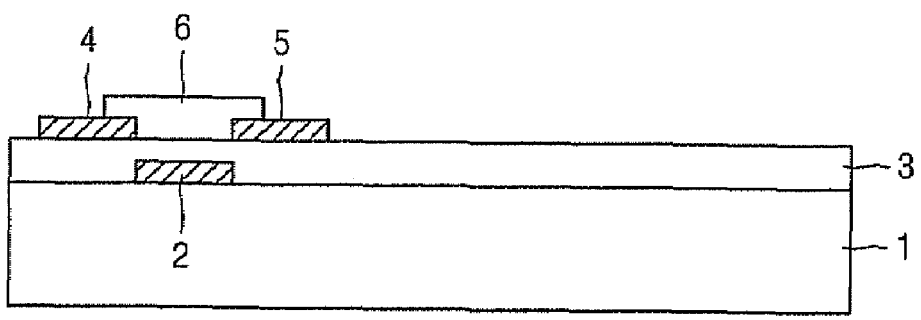

Referring to FIG. 2D, an organic semiconductor material, an exemplary embodiment of which is pentacene, is deposited on the resulting structure. Thereafter, the deposited organic semiconductor material is patterned to form an active layer 6 between the source electrode 4 and the drain electrode 5. The organic semiconductor material may be patterned in any of several well known methods, an exemplary embodiment of which is a photoresist method.

Figure 2E:
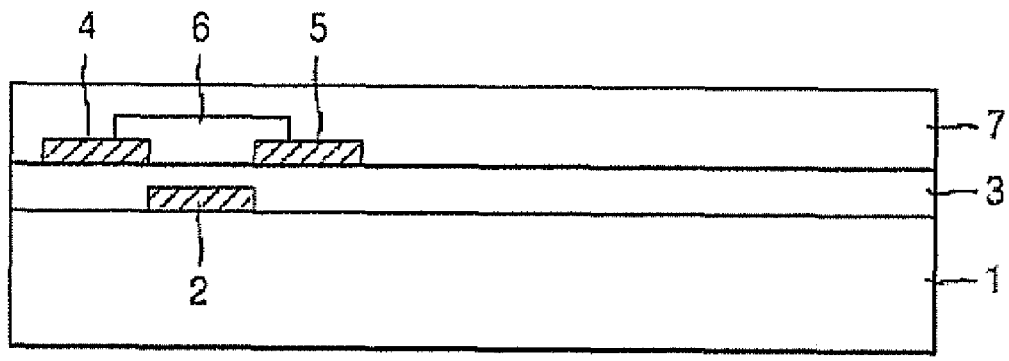

Referring to FIG. 2E, a passivation layer 7, acting as a planarization layer, is formed on the resulting structure using an organic or inorganic insulating material.

Figure 2F:
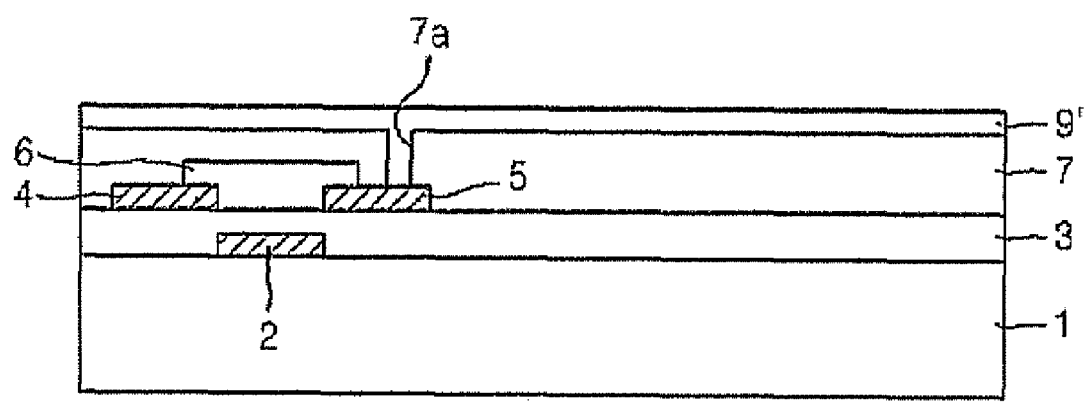

Referring to FIG. 2F, a hole 7a is formed in the passivation layer 7, and a transparent conductive material 9', one exemplary embodiment of which is ITO, is deposited on the resulting structure. The hole 7a may be formed through any of several well known methods, an exemplary embodiment of which is a photoresist method.

Figure 2G:
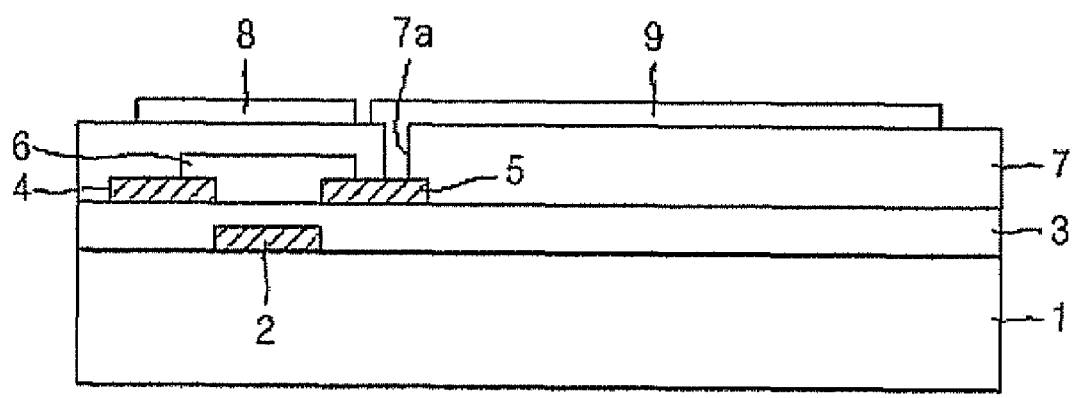

Referring to FIG. 2G, the deposited transparent conductive material 9' is patterned to form a protective layer 8 and an anode (also called a lower electrode) 9. An exemplary embodiment of a method of patterning the transparent conductive material 9' is through the use of chemical vapor deposition ("CVD") and a mask (not shown).

Figure 2H:
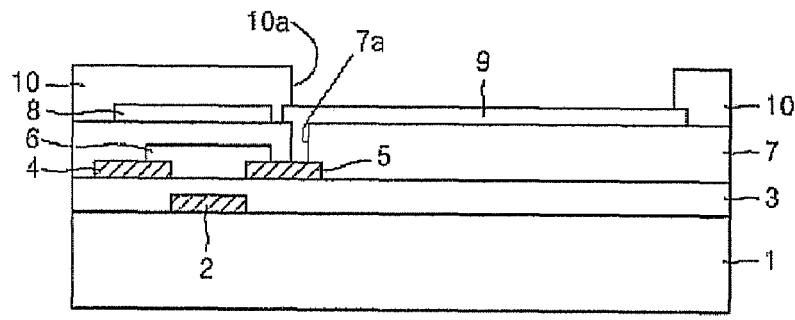

Referring to FIG. 2H, a bank 10 with a window 10a is formed on the resulting structure such that a surface of the anode 9 is exposed by the window 10a. Exemplary embodiments of the bank 10 may be formed of PVA, PA, PI, or black photoresist.

Figure 2I:
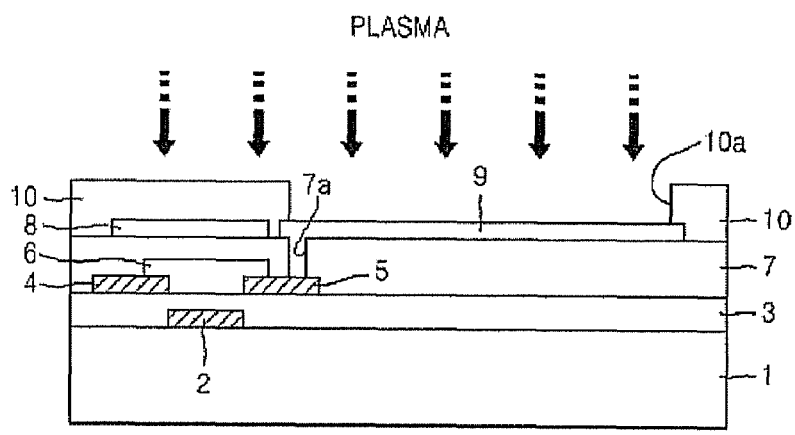

Referring to FIG. 2I, the anode 9 is surface-treated with plasma such that its surface energy is adjusted. In this process, the protective layer 8, which is covered by the bank 10, protects a pixel circuit thereunder from the plasma.

Figure 2J:
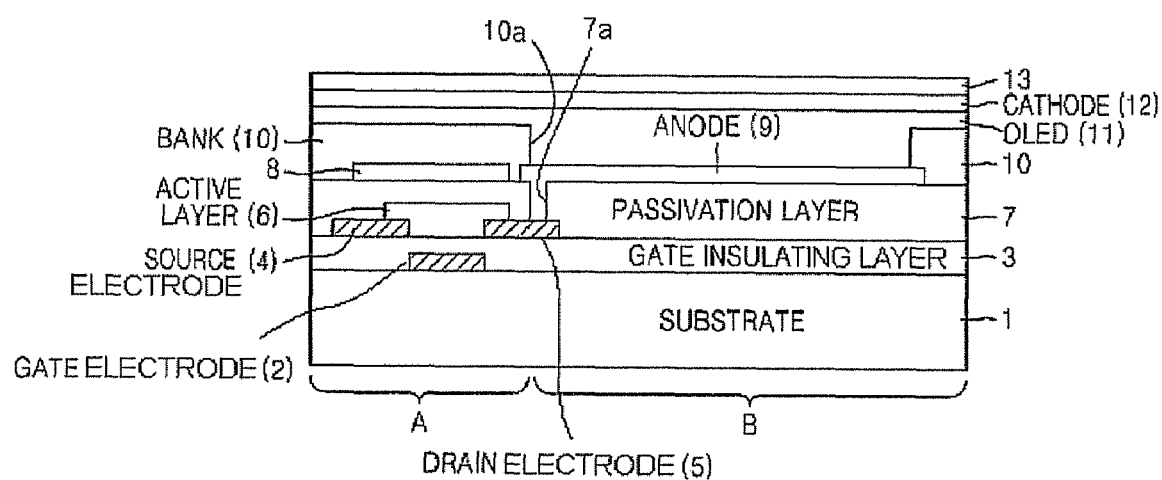

Referring to FIG. 2J, an OLED layer 11, including at least a hole transport layer and a luminescent layer, is formed of an organic material on the bank 10. In this process, the protective layer 8 protects the pixel circuit from the organic material. In one exemplary embodiment the OLED may be formed through an ink-jet process where the hole the different layers of the OLED (e.g., the hole transport layer and the luminescent layer) are formed by ink-jetting an OLED material, which has been dissolved in solvent, in the window 10a and allowing the solvent to evaporate.

Thereafter, a cathode (also called an upper electrode) 12, one exemplary embodiment of which is a reflective conductive material, is formed on the OLED layer 11. A sealing layer 13 is formed on the cathode 12, thereby completing fabrication of an OELD.

As described above, the OELDs according to the exemplary embodiments of the present invention are configured such that the pixel circuit including the switching transistor and the driving transistor are protected by the protective layer of transparent conductive material.

Accordingly, the pixel circuit under the protective layer can be protected from the plasma which is used for the surface treatment of the transparent anode. Also, the pixel circuit can be protected from the organic liquid material which is used to form the OLED layer.

In particular, the present invention can be conveniently applied to a bottom emission type OELD using an organic TFT and a fabrication method thereof.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic electro-luminescent display comprising:
   a substrate;
   a pixel circuit disposed in a unit pixel region defined on the substrate, the pixel circuit including a driving transistor;
   a passivation layer covering the unit pixel region including the pixel circuit;
   an organic light emitting diode including a transparent lower electrode connected to the driving transistor via a contact hole in the passivation layer, an organic light emitting layer, and an upper electrode which are sequentially formed on a portion of the passivation layer which overlaps a different area than the pixel circuit; and
   a protective layer, which is electrically isolated from the pixel circuit, formed of the same material as the transparent lower electrode and disposed on another portion of the passivation layer which overlaps the driving transistor of the pixel circuit.

2. The organic electro-luminescent display of claim 1, wherein the pixel circuit includes an organic thin film transistor.

3. The organic electro-luminescent display of claim 1, wherein the transparent lower electrode and the protective layer are formed of a conductive oxide selected from the group consisting of indium tin oxide and indium zinc oxide.

4. The organic electro-luminescent display of claim 2, wherein the transparent lower electrode and the protective layer are formed of a conductive oxide selected from indium tin oxide and indium zinc oxide.

5. The organic electro-luminescent display of claim 1, wherein the passivation layer is formed of an organic material.

6. The organic electro-luminescent display of claim 1, further comprising a bank formed between the passivation layer and the organic light emitting diode layer, the bank having a window through which the transparent lower electrode is exposed.

7. The organic electro-luminescent display of claim 2, further comprising a bank formed between the passivation layer and the organic light emitting diode layer, the bank having a window through which the transparent lower electrode is exposed.

8. The organic electro-luminescent display of claim 3, further comprising a bank formed between the passivation layer and the organic light emitting diode layer, the bank having a window through which the transparent lower electrode is exposed.

9. The organic electro-luminescent display of claim 4, further comprising a bank formed between the passivation layer and the organic light emitting diode layer, the bank having a window through which the transparent lower electrode is exposed.

10. The organic electro-luminescent display of claim 1, wherein the organic light emitting layer includes a hole transport layer and a luminescent layer.

11. A method of fabricating an organic electro-luminescent display, the method comprising:
    forming a pixel circuit including a driving transistor in each pixel region on a substrate;
    forming a passivation layer which protects the pixel circuit;
    forming a transparent lower electrode material layer on the passivation layer and in contact with the driving transistor via a contact hole in the passivation layer;
    patterning the transparent lower electrode material layer to form a protective layer, which is electrically isolated form the pixel circuit, on a portion of the passivation layer which corresponds to the driving transistor of the pixel circuit and a transparent lower electrode on a portion of the passivation layer which overlaps a different area than the pixel circuit; and
    forming an organic light emitting diode layer and a reflective upper electrode on the lower electrode.

12. The method of claim 11, wherein the pixel circuit includes an organic thin film transistor.

13. The method of claim 11, wherein the transparent lower electrode and the protective layer are formed to include a conductive oxide selected from the group consisting of indium tin oxide and indium zinc oxide.

14. The method of claim 12, wherein the transparent lower electrode and the protective layer are formed to include a conductive oxide selected from the group consisting of indium tin oxide and indium zinc oxide.

15. The method of claim 11, wherein the passivation layer is formed of an organic material.

16. The method of claim 11, further comprising forming a bank with a window between the passivation layer and the organic light emitting diode layer such that the transparent lower electrode is exposed by the window.

17. The method of claim 12, further comprising forming a bank between the passivation layer and the organic light emitting diode layer, wherein the bank is formed with a window such that the transparent lower electrode is exposed by the window.

18. The method of claim 13, further comprising forming a bank between the passivation layer and the organic light emitting diode layer, wherein the bank is formed with a window such that the transparent lower electrode is exposed by the window.

19. The method of claim 14, further comprising forming a bank between the passivation layer and the organic light emitting diode layer, wherein the bank is formed with a window such that the transparent lower electrode is exposed by the window.

20. The method of claim 11, wherein the forming of the organic light emitting diode layer includes forming a hole transport layer and a luminescent layer.

* * * * *